US012622124B2

(12) United States Patent
Lee et al.

(10) Patent No.: US 12,622,124 B2
(45) Date of Patent: May 5, 2026

(54) MULTI-LEVEL DEVICE AND METHOD OF MANUFACTURING THE SAME

(71) Applicant: POSTECH Research and Business Development Foundation, Pohang-si (KR)

(72) Inventors: Byoung Hun Lee, Pohang-si (KR); Yong Su Lee, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 516 days.

(21) Appl. No.: 18/102,612

(22) Filed: Jan. 27, 2023

(65) Prior Publication Data

US 2023/0422529 A1 Dec. 28, 2023

(30) Foreign Application Priority Data

Jun. 27, 2022 (KR) ........................ 10-2022-0078412

(51) Int. Cl.
*H10K 10/46* (2023.01)
(52) U.S. Cl.
CPC ......... *H10K 10/486* (2023.02); *H10K 10/466* (2023.02)
(58) Field of Classification Search
None
See application file for complete search history.

(56) References Cited

FOREIGN PATENT DOCUMENTS

KR 20080083126 A 9/2008
KR 20200073141 A * 6/2020 ............ H10D 10/00

OTHER PUBLICATIONS

Machine Translation of KR-2020-0073141 (Year: 2020).*

* cited by examiner

*Primary Examiner* — Anthony Ho
(74) *Attorney, Agent, or Firm* — Morgan, Lewis & Bockius LLP

(57) ABSTRACT

Disclosed herein are a multi-level device which has a ternary characteristic and can reduce hysteresis, and a method of manufacturing the same. The multi-level device can have a plurality of turn-on voltages, that is, a plurality of threshold voltages, thereby providing multi-level conductivity as a ternary device characteristic. In addition, a double insulating layer made of a dielectric layer and an organic polymer layer is used as a separation layer for channel layer separation, and by removing the hysteresis due to a trap charge at an interface between a channel layer and an insulating layer, a uniform ternary characteristic can always be maintained, and by forming the channel layer on an organic polymer layer, the channel layer can be more stably formed on the insulating layer.

11 Claims, 18 Drawing Sheets

160
152
151 } 150
140
132
131 } 130
120
110

160

MULTI-LEVEL DEVICE AND METHOD OF MANUFACTURING THE SAME

CROSS-REFERENCE TO RELATED APPLICATIONS

This application claims priority to Korean Patent Application No. 10-2022-0078412 filed on Jun. 27, 2022 in the Korean Intellectual Property Office (KIPO), the entire contents of which are hereby incorporated by reference.

BACKGROUND

1. Technical Field

The present invention is related to a multi-level device and a method of manufacturing the same, and more particularly, to a multi-level device having a ternary characteristic and a method of manufacturing the same.

2. Related Art

While the demand for low-power and high-integration devices is increasing due to the recent development of the digital information communication and home appliance industries, it is known that the power consumption and high integration of devices based on conventional charge control have reached a limit.

Meanwhile, multi-level devices (multi-valued logics) are being researched to replace logic devices (logic architectures), and research on ternary logic devices using three logic states is being actively conducted. Since a multi-level device can reduce the number of transistors and a length of an interconnection connecting devices when compared to a binary logic device, it is expected to be able to greatly reduce power consumption.

However, the multi-level device has a problem in that, when a voltage of a specific level is applied to a gate electrode, a current value between a source electrode and a drain electrode is not always maintained uniformly due to a hysteresis characteristic.

RELATED ART DOCUMENT

Patent Document (Patent Document 1) Korean Patent Laid-Open Application No. 10-2008-0083126

SUMMARY

The present invention provides a multi-level device having a ternary characteristic and capable of reducing hysteresis, and a method of manufacturing the same.

In some example embodiments, a multi-level device includes a substrate, a gate electrode formed on the substrate, a first separation layer formed on the substrate and the gate electrode, a first channel layer formed on the first separation layer, a second separation layer formed on the first channel layer, a second channel layer formed on the second separation layer, and a source electrode and a drain electrode which are formed on the second channel layer, wherein each of the first separation layer and the second separation layer includes an organic polymer layer.

The first separation layer may include a first dielectric layer formed on the substrate and the gate electrode, and a first organic polymer layer formed on the first dielectric layer.

The second separation layer may include a second dielectric layer formed on the first channel layer, and a second organic polymer layer formed on the second dielectric layer.

The first dielectric layer and the second dielectric layer may each be formed of any one material among aluminum oxide, aluminum nitride, aluminum oxynitride, and aluminum nitride oxide.

Each of the first organic polymer layer and the second organic polymer layer may include a polymer-based material.

The polymer-based material may include any one material of polymethyl methacrylate (PMMA) and polystyrene (PS).

The first separation layer may have a thickness ranging from 30 nm to 50 nm, and the first organic polymer layer may have a thickness that is greater than a thickness of the first dielectric layer.

The second separation layer may have a thickness ranging from 30 nm to 50 nm, and the second organic polymer layer may have a thickness that is greater than a thickness of the second dielectric layer.

Each of the first organic polymer layer and the second organic polymer layer may have a thickness ranging from 20 nm to 30 nm.

A gate voltage applied to the gate electrode may have a first voltage range, a second voltage range, and a third voltage range as the gate voltage increases in a negative direction according to the operation of the first channel layer or the second channel layer.

A channel may be formed in the second channel layer in the first voltage range, the channel of the second channel layer may be maintained in the third voltage range, and a channel may be formed in the first channel layer.

A channel may be formed in the second channel layer in the first voltage range, and a current flowing in the second channel layer may be saturated in the second voltage range.

A threshold voltage for forming a channel in the first voltage range and a threshold voltage for forming a channel in the third voltage range may have different values.

In other example embodiments, a method of manufacturing a multi-level device includes forming a gate electrode on a substrate, forming a first separation layer including an organic insulating layer on the substrate and the gate electrode, forming a first channel layer on the first separation layer, forming a second separation layer including an organic insulating layer on the first channel layer, forming a second channel layer on the second separation layer, and forming a source electrode and a drain electrode on the second channel layer.

The forming of the first separation layer may include forming a first dielectric layer on the substrate and the gate electrode, and forming a first organic polymer layer on the first dielectric layer.

The forming of the second separation layer may include forming a second dielectric layer on the first channel layer, and forming a second organic polymer layer on the second dielectric layer.

Each of the first dielectric layer and the second dielectric layer may include $Al_2O_3$, and each of the first organic polymer layer and the second organic polymer layer may include polymethyl methacrylate (PMMA) or polystyrene (PS).

Each of the first organic polymer layer and the second organic polymer layer may have a thickness ranging from 20 nm to 30 nm.

The forming of the source electrode and the drain electrode may include forming a first metal layer on the second channel layer, patterning the first metal layer using a photolithography process, and then patterning the first separation layer, the first channel layer, the second separation layer, and the second channel layer in the form of the patterned first metal layer, depositing a second metal layer made of the same material as the first metal layer to surround the first separation layer, the first channel layer, the second separation layer, the second channel layer, and the first metal layer, which are patterned, and patterning the second metal layer using a photolithography process to form the source electrode and the drain electrode.

BRIEF DESCRIPTION OF DRAWINGS

Example embodiments of the present invention will become more apparent by describing example embodiments of the present invention in detail with reference to the accompanying drawings, in which:

FIGS. 2A to 4B are diagrams for describing a hysteresis control characteristic according to a thickness of an organic polymer layer of the multi-level device according to the present invention:

DESCRIPTION OF EXAMPLE EMBODIMENTS

Figure 1:
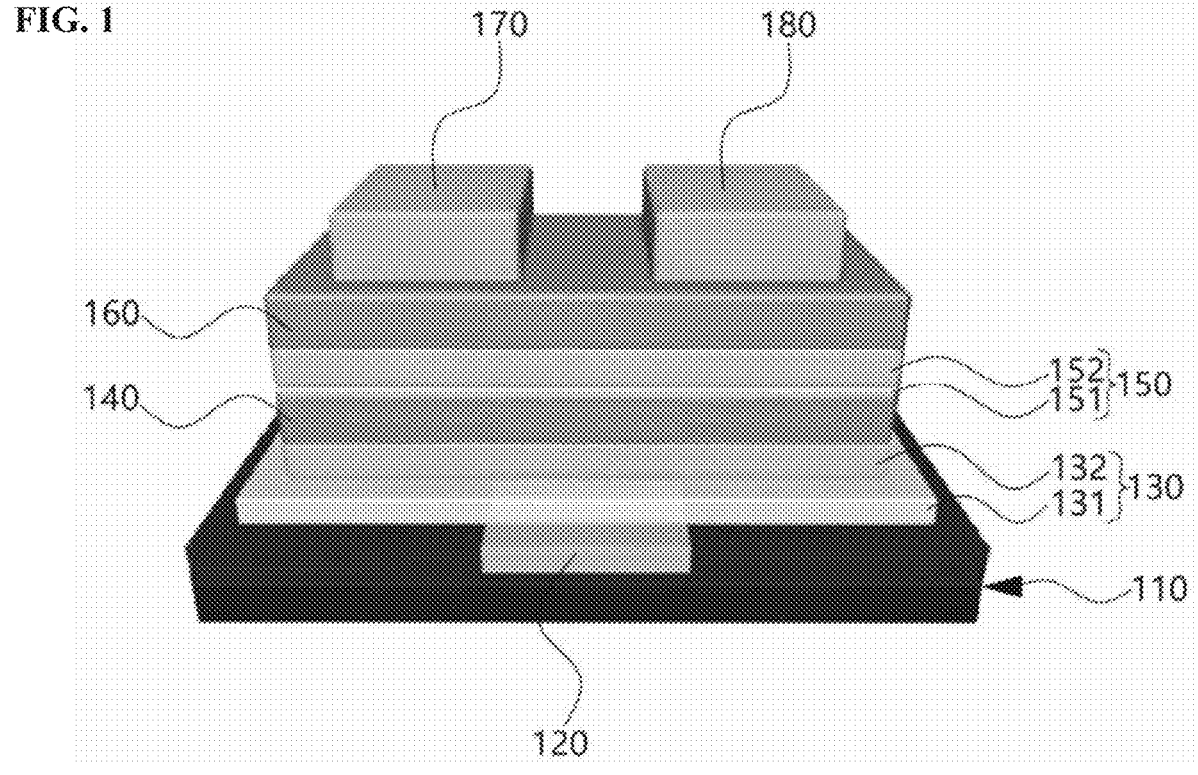
FIG. 1 is a diagram illustrating a multi-level device of the present invention.

The present invention may be modified into various forms and may have a variety of embodiments, and therefore, specific embodiments will be illustrated in the accompanying drawings and described. The embodiments, however, are not to be taken in a sense which limits the present invention to the specific embodiments, and should be construed to include modifications, equivalents, or substituents within the spirit and technical scope of the present invention. Also, in the following description of the present invention, when a detailed description of a known related art is determined to obscure the gist of the present invention, the detailed description thereof will be omitted.

Hereinafter, embodiments according to the present invention will be described in detail with reference to the accompanying drawings, wherein the same or corresponding components are assigned the same reference numerals, and duplicate description thereof will be omitted.

Embodiment

FIG. 1 is a diagram illustrating a multi-level device of the present invention.

Referring to FIG. 1, the multi-level device according to the present invention includes a substrate 110, a gate electrode 120, a first separation layer 130, a first channel layer 140, a second separation layer 150, a second channel layer 160, a source electrode 170, and a drain electrode 180.

The substrate 110 may include a transparent substrate such as glass, a silicon substrate, or a flexible substrate such as a plastic substrate or a metal foil substrate. Examples of the plastic substrate may include polyethersulphone, polyacrylate, polyetherimide, polyethylene naphthalate, polyethylene terephthalate, polyphenylene sulfide, polyallylate, polyimide, polycarbonate, cellulose triacetate, or cellulose acetate propionate. A silicon (Si) substrate having silicon oxide ($SiO_2$) formed on a surface thereof may be preferably used as substrate 110.

The gate electrode 120 may be formed on the substrate 110. For example, the gate electrode 120 may be disposed to be buried in an upper portion of the substrate 110, and an upper surface of the gate electrode 120 may be positioned to be coplanar with an upper surface of the substrate 110. The gate electrode 120 may be a metal layer made of a metal. The metal may include at least one among gold (Au), silver (Ag), platinum (Pt), chromium (Cr), titanium (Ti), copper (Cu), aluminum (Al), tantalum (Ta), molybdenum (Mo), tungsten (W), nickel (Ni), palladium (Pd), and an alloy thereof. In addition, a metal oxide may be used as gate electrode 120. The metal oxide may include at least one among indium tin oxide (ITO), indium zinc oxide (IZO), indium tin zinc oxide (ITZO), Al doped zinc oxide (AZO), and gallium zinc oxide (GZO).

The first separation layer 130, the first channel layer 140, the second separation layer 150, and the second channel layer 160 may be sequentially formed on the gate electrode 120 and the substrate 110. The multi-level device has different threshold voltages due to stacked layers according to a range of a gate voltage applied to the gate electrode 120 and has a changeable state of a current due to the different threshold voltages, For example, the first separation layer 130 and the second separation layer 150 serve as insulating layers, the first separation layer 130 may be disposed between the gate electrode 120 and the first channel layer 140 to separate the gate electrode 120 from the first channel layer 140, and the second separation layer 150 may be disposed between the first channel layer 140 and the second channel layer 160 to separate the first channel layer 140 from the second channel layer 160. In addition, the separation layers 130 and 150 may form interfaces with the channel layers 140 and 160, and the separation layers 130 and 150 may be formed to have band gaps that are greater than those of the channel layers 140 and 160 so that the first channel layer 140 disposed between the first separation layer 130 and the second separation layer 150 may form a quantum well. As another example, a third separation layer (not shown) may be disposed on the second channel layer 160, and a third channel layer (not shown) may be formed on the third separation layer. However, when three channel layers and three separation layers are formed, the number of different threshold voltages may also be increased.

In addition, the first separation layer 130 may include a first dielectric layer 131 and a first organic polymer layer 132.

The first dielectric layer 131 may be formed on the gate electrode 120 and the substrate 110. The first dielectric layer 131 is an insulating layer for insulating the gate electrode 120 from the first channel layer 140 and may be formed of any one among aluminum oxide ($Al_2O_3$), aluminum nitride, and an inorganic insulating film including aluminum oxynitride or aluminum nitride oxide, and preferably, $Al_2O_3$ may be used. For example, the first dielectric layer 131 may be formed to have a thickness ranging from 5 nm to 15 nm on the gate electrode 120.

The first organic polymer layer 132 may be formed on the first dielectric layer 131. That is, the first separation layer 130 may be formed in a double structure of the first dielectric layer 131/first organic polymer layer 132. In this case, the first organic polymer layer 132 may be formed to have a thickness that is greater than that of the first dielectric layer 131. The first organic polymer layer 132 may be formed of any one among polymethyl (meth)acrylate (PMMA), polyethylene (PS), polyvinylpyrrolidone (PVP), polyvinyl acetate (PVA), and polyimide (PI), and preferably, PMMA may be used. Accordingly, the first separation layer 130 may be an insulating layer formed in a dual structure of $Al_2O_3$/PMMA.

Typically, there is a problem in that, at a bonding interface where an inorganic or organic insulating film and an organic semiconductor are in contact with each other, a trap charge may occur at the interface due to the nature of an organic material or hysteresis may occur to a sweep direction of a gate voltage due to polarization by external moisture. That is, when a voltage of a specific level is applied to the gate electrode 120, a magnitude of a current between the source electrode 170 and the drain electrode 180 should always be constant. However, there is a problem in that, due to the hysteresis by the trap charge at the interface, uniform characteristics are not always maintained.

In order to solve the above problems caused by the hysteresis characteristic, in the multi-level device according to the present invention, the first separation layer 130 disposed between the gate electrode 120 and the first channel layer 140 is formed to include the first dielectric layer 131 and the first organic polymer layer 132 and thus the hysteresis characteristic can be removed. That is, the first organic polymer layer 132 is formed between the first dielectric layer 131 and the first channel layer 140, and a current formed from the first channel layer 140 is blocked using the first organic polymer layer 132, and thus hysteresis can be controlled. Hysteresis control using the first organic polymer layer 132 will be described in detail below.

In addition, by forming the first channel layer 140 on the first organic polymer layer 132, the first channel layer 140 formed of an organic semiconductor may be stably formed on the insulating layer.

The first organic polymer layer 132 may be formed to have a thickness of 20 nm or more on the first dielectric layer 131. For example, in order to remove hysteresis, the first organic polymer layer 132 may be formed to have a thickness ranging from 20 nm to 30 nm. For example, when the thickness of the first organic polymer layer 132 is less than 20 nm, there is a problem in that the hysteresis characteristic is not completely removed. In addition, when the thickness of the first organic polymer layer 132 is greater than 30 nm, since the entire thickness of the insulating layer that is the first separation layer 130, is too thick, a characteristic of a ternary device may not be exhibited. Therefore, the entire thickness of the first separation layer 130 formed on the gate electrode 120 may range from 30 nm to 50 nm, and the first organic polymer layer 132 may be formed to have a thickness ranging from 20 nm to 30 nm.

Subsequently, the first channel layer 140 is formed on the first separation layer 130. More specifically, the first channel layer 140 may be disposed on the first organic polymer layer 132. The first channel layer 140 may include dinaphthothienothiophene (DNTT), pentacene, tetracene, oligothiophene, polythiophene, metal phthalocyanine, polyphenylene, polyvinylenephenylene, polyfluorene, or fullerene (C60), and preferably, DNTT may be used. The first channel layer 140 may have a thickness ranging from several to several tens of nanometers. A lower surface of the first channel layer 140 is disposed in contact with the first separation layer 130, and an upper surface thereof is disposed in contact with the second separation layer 150 so that a quantum well may be formed.

The second separation layer 150 may be formed on the first channel layer 140. The second separation layer 150 may be formed of the same material in the same configuration as the first separation layer 130. For example, the second separation layer 150 may include a second dielectric layer 151 and a second organic polymer layer 152.

The second dielectric layer 151 may be formed on the first channel layer 140. The second dielectric layer 151 is an insulating layer for separating the first channel layer 140 from the second channel layer 160 and may be formed of any one among $Al_2O_3$, aluminum nitride, and an inorganic insulating film including aluminum oxynitride or aluminum nitride oxide, and preferably, $Al_2O_3$ may be used. For example, the second dielectric layer 151 may be formed to have a thickness ranging from 5 nm to 15 nm on the first channel layer 140.

The second organic polymer layer 152 may be formed on the second dielectric layer 151. That is, the second separation layer 150 may be formed in a double structure of the second dielectric layer 151/second organic polymer layer 152. In this case, the second organic polymer layer 152 may be formed to have a thickness that is greater than that of the second dielectric layer 151. The second organic polymer layer 152 may be formed of any one among PMMA, PS, PVP, PVA, and PI, and preferably, PMMA may be used. Accordingly, the second separation layer 150 may be an insulating layer formed in the same double structure of $Al_2O_3$/PMMA as the first separation layer 130.

The second separation layer 150 disposed between the first channel layer 140 and the second channel layer 160 is formed to include the second organic polymer layer 152 so that the hysteresis characteristic may be controlled, and when the multi-level device operates, a current of the first channel layer 140 may be completely blocked in a specific section. In addition, by forming the second channel layer 160 on the second organic polymer layer 1522, the second channel layer 160 formed of an organic semiconductor may be stably formed on the insulating layer.

For example, in order to remove hysteresis and completely block the current of the first channel layer 140, the thickness of the second organic polymer layer 152 may be formed to have the same thickness as the first organic polymer layer 132. For example, the second organic polymer layer 152 may be formed to have a thickness ranging from 20 nm to 30 nm. Therefore, the thickness of the second separation layer 150 formed on the first channel layer 140 may range from 30 nm to 50 nm, and the second organic polymer layer 152 may be formed to have a thickness ranging from 20 nm to 30 nm.

Subsequently, the second channel layer 160 is formed on the second separation layer 150. More specifically, the second channel layer 160 may be disposed on the second organic polymer layer 152. The second channel layer 160 may include DNTT, pentacene, tetracene, oligothiophene, polythiophene, metal phthalocyanine, polyphenylene, polyvinylenephenylene, polyfluorene, or fullerene (C60), and preferably, DNTT may be used as in the first channel layer 140.

The source electrode 170 and the drain electrode 180 may be disposed on the second channel layer 160. The source electrode 170 and the drain electrode 180 may each be a metal layer made of a metal. The metal may include at least one among Au, Ag, Pt, Cr, Ti, Cu, Al, Ta, Mo, W, Ni, Pd, and an alloy thereof. In addition, a metal oxide may be used as the source electrode 170 or the drain electrode 180. The metal oxide includes at least one among ITO, IZO, ITZO, AZO, and GZO.

Hysteresis Control Example

FIGS. 2A to 4B are diagrams for describing a hysteresis control characteristic depending on a thickness of an organic polymer layer of the multi-level device according to the present invention.

Figures 2A, 2B:
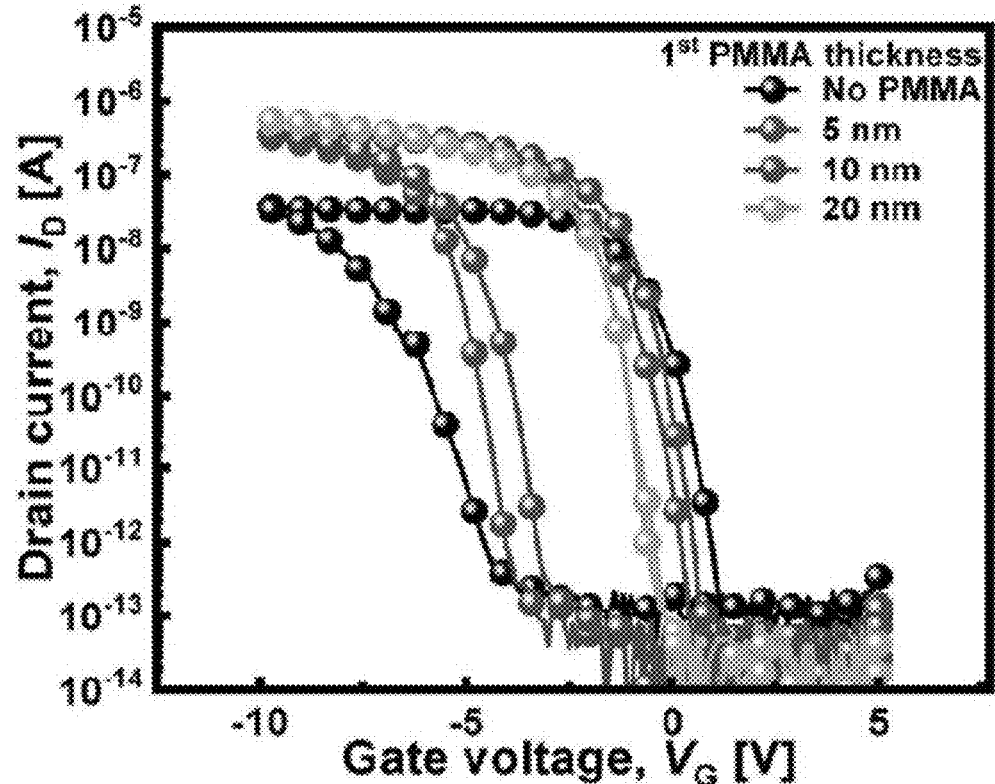

Here, FIG. 2A shows a single channel transistor in which only the first separation layer 130 of $Al_2O_3$/PMMA is formed between the gate electrode 120 and the first channel layer 140 of DNTT, and FIG. 2B shows a current-voltage characteristic when the thickness of PMMA, which is the first organic polymer layer 132, is changed in the configuration of FIG. 2A.

Figure 3A:
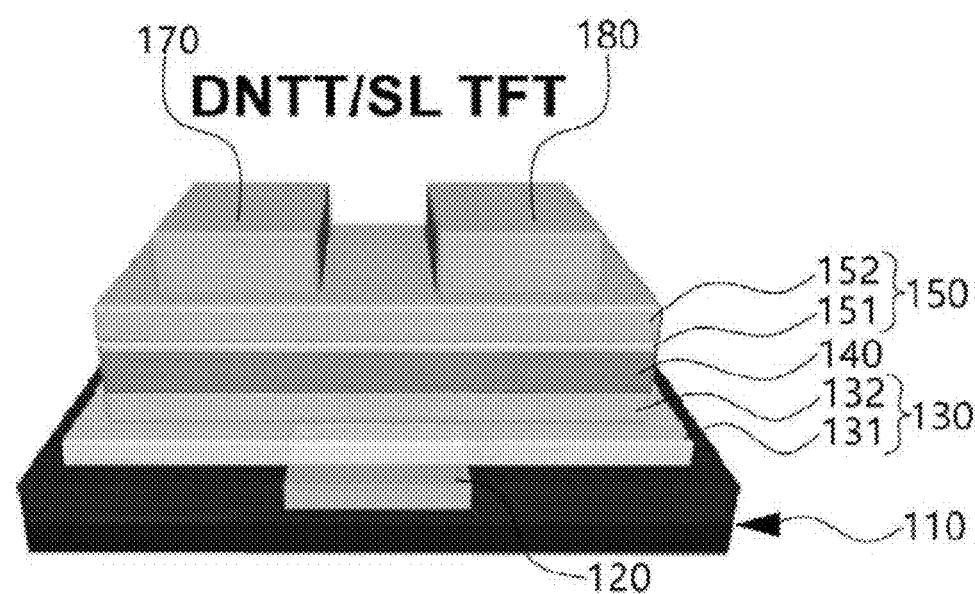
Figure 3B:
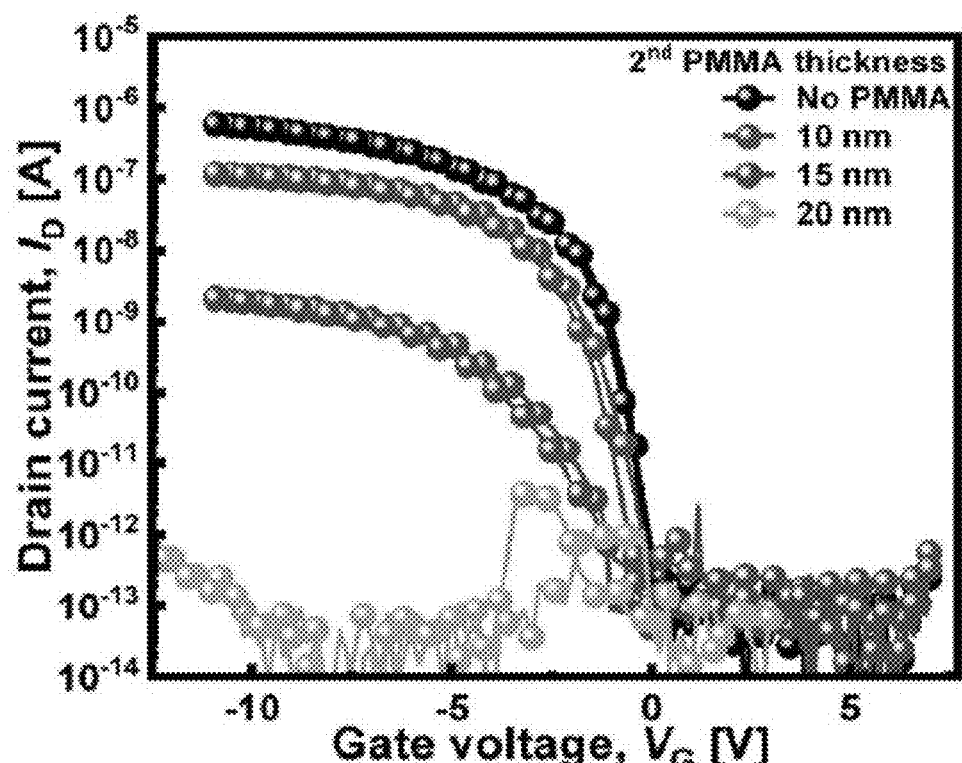

In addition, FIG. 3A shows a configuration in which the second separation layer 150 of $Al_2O_3$/PMMA is disposed on the first channel layer 140 and the source and drain electrodes 170 and 180 are disposed on the second separation layer 150 comparing with the single channel configuration shown in FIG. 2A, and FIG. 3B shows a current-voltage characteristic when the thickness of PMMA, which is the second organic polymer layer 152, is changed in the configuration of FIG. 3A.

Figure 4A:
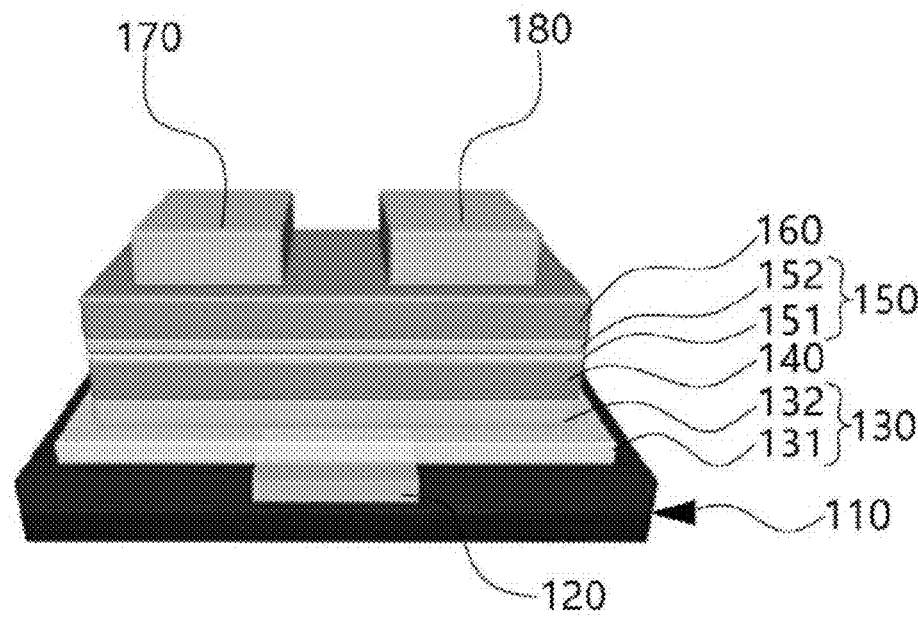
Figure 4B:
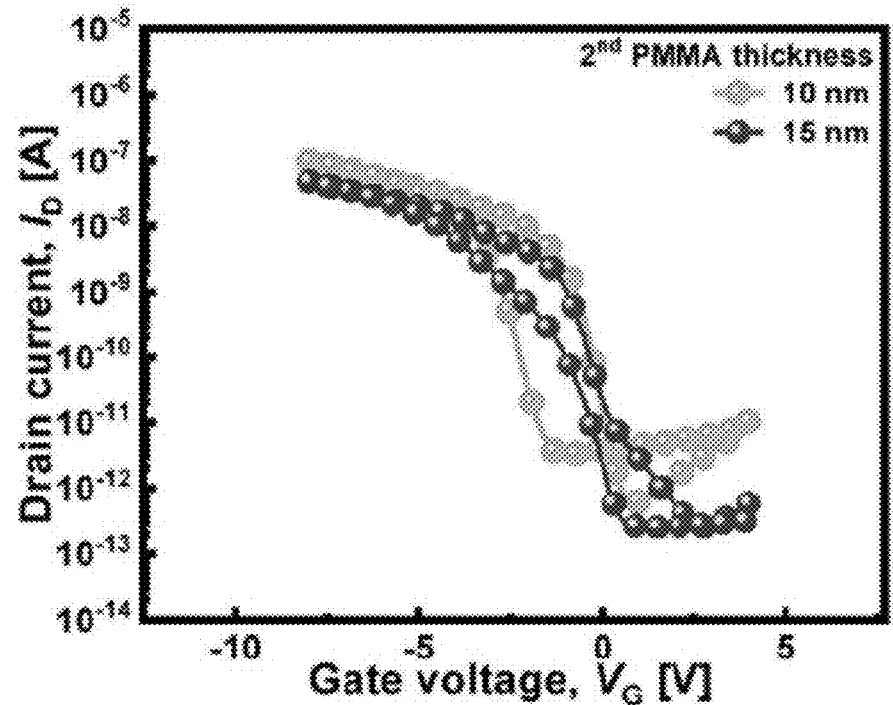

FIG. 4A shows a configuration of the multi-level device of the present invention in which the second channel layer 160 of DNTT is added on the second separation layer 150 in the single channel configuration shown in FIG. 3A, and FIG. 4B shows a current-voltage characteristic when the thickness of PMMA, which is the second organic polymer layer 152, is changed in the configuration of FIG. 4A.

The hysteresis control characteristic of the multi-level device according to the present invention will be described in detail below with reference to FIGS. 2A to 4B.

First, referring to FIGS. 2A and 2B, it can be confirmed that, when the thickness of PMMA which is the first organic polymer layer 132 is respectively 5 nm and 10 nm, the hysteresis is gradually reduced when compared to when the PMMA is not present, but the hysteresis characteristic is still exhibited. However, it can be confirmed that, when the thickness of the PMMA is 20 nm, the hysteresis characteristic is removed. That is, it can be confirmed that the hysteresis characteristic is controllable through the thickness change of the PMMA disposed between the gate electrode 120 and the first channel layer 140, and the hysteresis is removed when the PMMA has a thickness of 20 nm or more.

Referring to FIGS. 3A and 3B, it can be confirmed that, when the second organic polymer layer 152 is formed on the first channel layer 140 of the single channel configuration shown in FIG. 2A, the current of the channel layer decreased as the thickness of PMMA of the second organic polymer layer 152 is increased. That is, it can be confirmed that, when the thickness of PMMA of the second organic polymer layer 152 is 10 nm or 15 nm, the current gradually decreases compared to when the PMMA 152 is not present, and when the thickness of the PMMA 152 is 20 nm, the current of the first channel layer 140 is completely blocked. That is, it can be confirmed that the current of the channel layer is controlled through the thickness change of the PMMA 152 of the second separation layer 150 formed on the first channel layer 140.

FIG. 4A shows the configuration of the multi-level device of the present invention in which the second channel layer 160 of DNTT is added on the second separation layer 150 of the single channel configuration shown in FIG. 3A. However, it can be confirmed that, when the thickness of PMMA of the second organic polymer layer 152 of the second separation layer 150 has a thickness of 10 nm and 15 nm, a ternary device characteristic having a ternary logic due to the hysteresis characteristic is not exhibited. That is, when the thickness of PMMA of the second organic polymer layer 152 does not have a sufficient thickness, since a current of the first channel layer 140 is not sufficiently blocked, there is a problem in that a ternary device characteristic is not formed. In addition, due to a problem in that the current of the first channel layer 140 is not completely blocked, an unstable state may occur in which turning on the first channel layer 140 and the second channel layer 160 and the order in which the channel layers are turned on are not constant.

Therefore, in order to remove the hysteresis of the multi-level device and completely block the current of the first channel layer 140 to allow the multi-level device to have a ternary logic characteristic, the organic polymer layers 132 and 152 are additionally formed at the separation layers 130 and 150, and the organic polymer layers 132 and 152 may each be formed to have a thickness of 20 nm or more, and specifically, ranging from 20 nm to 30 nm.

Operation Example of Multi-Level Device

Figure 5:
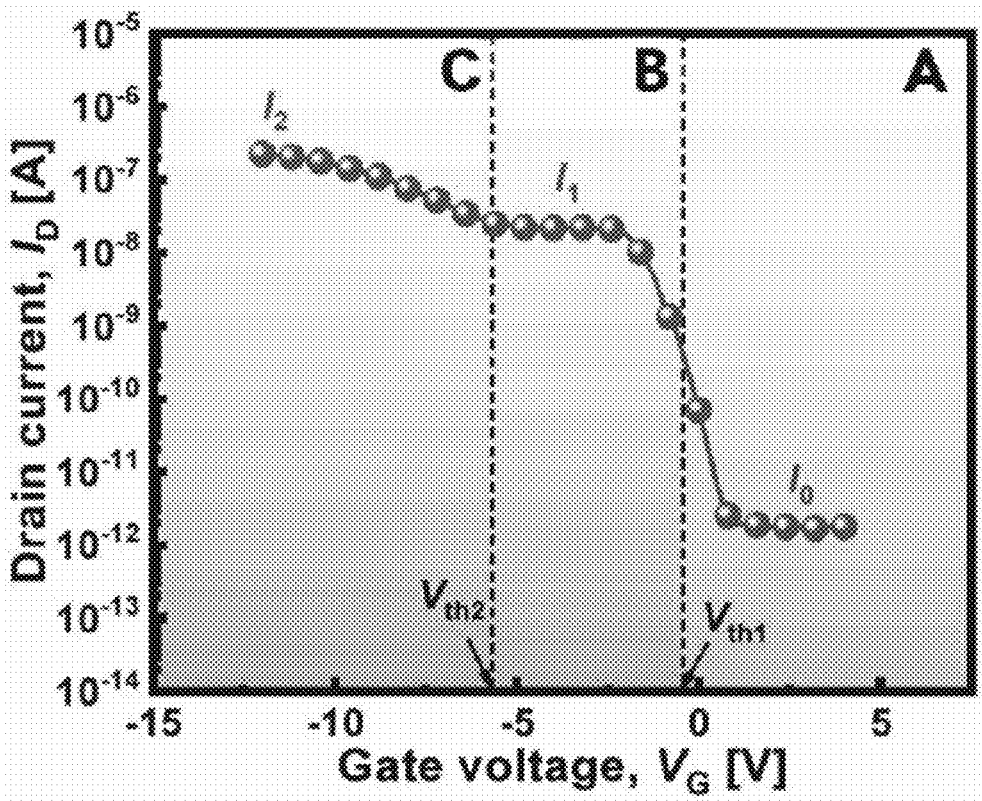
FIG. 5 is a graph showing a transfer characteristic of the multi-level device according to the present invention.

FIG. 5 is a graph showing a transfer characteristic of the multi-level device according to the present invention.

Figure 6:
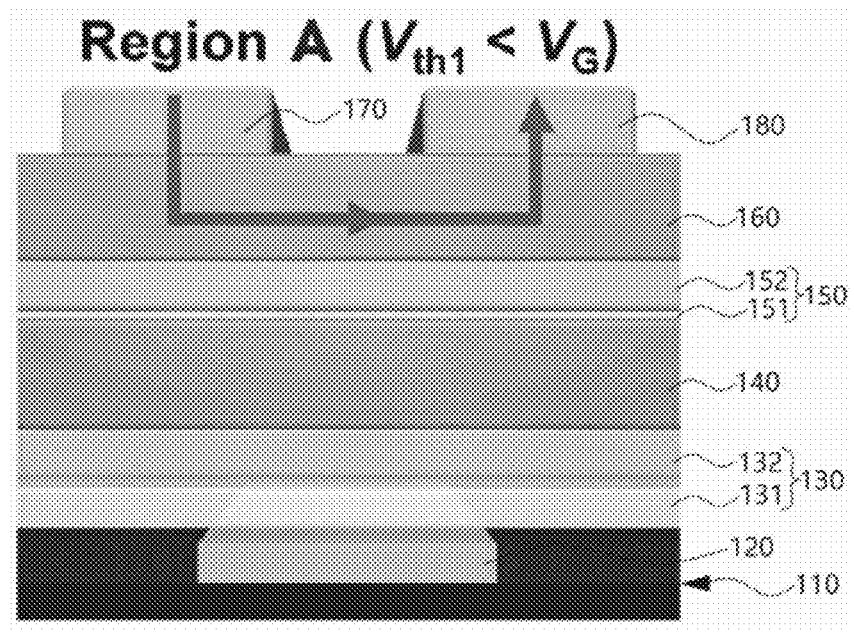
FIGS. 6 to 8 are diagrams for describing an operation characteristic for each stage of the multi-level device of the present invention.
Figure 7:
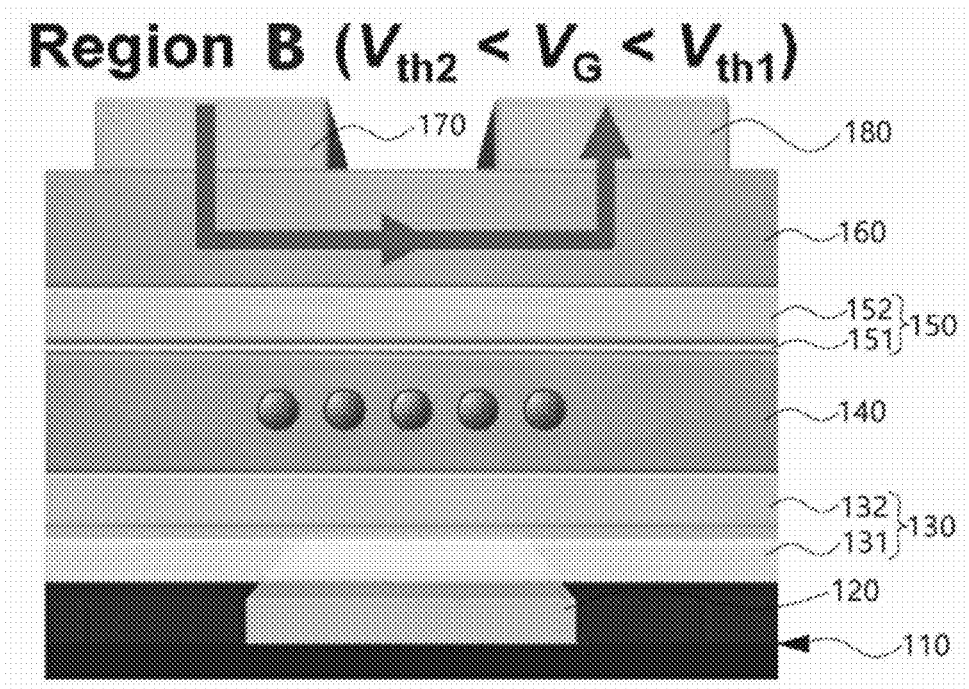
Figure 8:
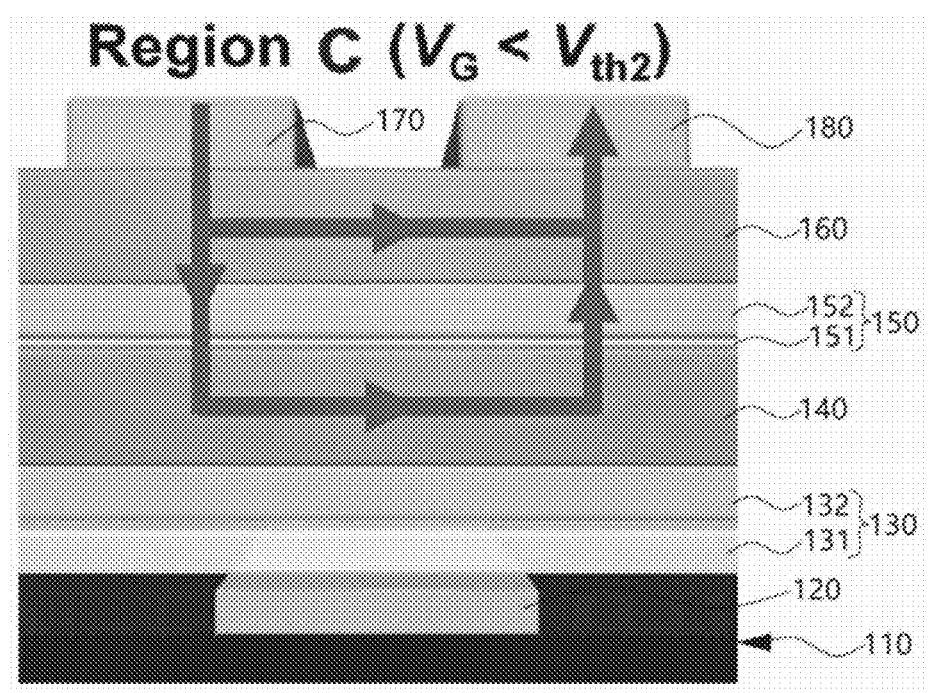

FIGS. 6 to 8 are diagrams for describing an operation characteristic for each stage of the multi-level device of the present invention.

An operation of the multi-level device will be described in detail below with reference to FIGS. 5 to 8.

Here, a transfer characteristic curve of the multi-level device shown in FIG. 5 may be a transfer characteristic curve of a P-type semiconductor device. In addition, the operation for each stage of the multi-level device shown in FIGS. 6 to 8 may be an operation characteristic for each stage according to the transfer characteristic curve of the P-type semiconductor device shown in FIG. 5.

First, referring to FIGS. 5 and 6, when a voltage $V_G$ applied to the gate electrode 120 is in the first voltage range A of FIG. 5, that is, a voltage ($V_{th1} < V_G$) that is more than or equal to a first threshold voltage $V_{th1}$ is applied to the gate electrode 120, holes are accumulated enough to form a channel in the second channel layer 160, and thus the second channel layer 160 may be turned on first. In addition, as the gate voltage $V_G$ applied to the gate electrode 120 increases in a negative direction within the first voltage range A, a current $I_0$ flowing in the second channel layer 160 may also increase. In this case, the first channel layer 140 may be turned off. That is, the second channel layer 160 is turned on in the first voltage range A, and thus the current $I_0$ may flow between the source electrode 170 and the drain electrode 180. However, since the voltage $V_G$ applied to the gate electrode 120 is not sufficient to turn the first channel layer 140 on, the turn-off state of the first channel layer 140 may remain.

Referring to FIGS. 5 and 7, the voltage $V_G$ applied to the gate electrode 120 is in a second voltage range B of FIG. 5, that is, a voltage ($V_{th2}$<$V_G$<$V_{th1}$) between the first threshold voltage $V_{th1}$ and a second threshold voltage $V_{th2}$ is applied to the gate electrode 120, a current $I_1$ flowing between the source electrode 170 and the drain electrode 180 may increase to a certain level and then maintain the certain level. That is, a turn-on state of the first channel layer 140 remains and a turn-off state of the second channel layer 160 remains in the second voltage range B, and the current $I_1$ flowing between the source electrode 170 and the drain electrode 180 may not increase any more at the certain level and may remain at the certain level. This may mean that an amount of the current in the first channel layer 140 increases to a certain level and then is rapidly saturated in the second voltage range B. The current saturation can be understood as charges accumulated in the first channel layer 140 due to the blocking of charge transfer by the second separation layer 150 screening a gate field.

Next, referring to FIGS. 5 and 8, when the voltage $V_G$ applied to the gate electrode 120 is in a third voltage range C of FIG. 5, that is, a voltage ($V_G$<$V_{th2}$) that is less than or equal to the second threshold voltage $V_{th2}$ is applied to the gate electrode 120, holes may be sufficiently accumulated to form a channel even in the first channel layer 140, and thus the first channel layer 140 may also be turned on. That is, holes from the source electrode 170 may pass through the second channel layer 160 to tunnel the second separation layer 150 and then flow along the first channel layer 140. The holes flowing through the first channel layer 140 may tunnel the second separation layer 150 again and pass through the second channel layer 160 to be provided to the drain electrode 180.

Since both the first channel layer 140 and the second channel layer 160 are turned on in the third voltage range C, a current $I_2$ that is greater than the current in the first voltage range A or the second voltage range B may flow between the source electrode 170 and the drain electrode 180. This can be understood as the gate field further increasing as an absolute value of the gate voltage $V_G$ applied to the gate electrode 120 increases within the third voltage range C, and the charges of the first channel layer 140 contributing to the current in a tunneling phenomenon through the second separation layer 150 so that the current increases again.

As described above, in the multi-level device according to the present invention, when the gate voltage $V_G$ of the first voltage range A is applied to the gate electrode 120, only the second channel layer 160 may be turned on, and the turn-off state of the first channel layer 140 may remain. In addition, when the gate voltage $V_G$ in the second voltage range B that is greater than that in the first voltage range A in the negative direction is applied, the turn-on state of the second channel layer 160 may remain, and current movement may become saturated. Thereafter, when the gate voltage $V_G$ in the third voltage range C that is greater than that in the second voltage range B in the negative direction is applied, both the first channel layer 140 and the second channel layer 160 may be turned on. Accordingly, the multi-level device according to the present invention may have a plurality of turn-on voltages, that is, a plurality of threshold voltages, thereby providing multi-level conductivity.

In addition, the channel layers deposited on the insulating layers may be more stably formed by the first organic polymer layer 132 of the first separation layer 130 and the second organic polymer layer 152 of the second separation layer 150, and the hysteresis due to the trap charge at the interface is removed so that the uniform ternary characteristic may always be maintained.

Manufacturing Example of Multi-Level Device

FIGS. 9A to 17B are diagrams illustrating a method of manufacturing a multi-level device of the present invention.

Here, FIGS. 9A, 10A, 11A, 12A, 13A, 14A, 15A, 16A, and 17A show cross-sectional views illustrating the multi-level device of the present invention, and FIGS. 9B, 10B, 11B, 12B, 13B, 14B, 15B, 16B, and 17B show plan views of FIGS. 9A, 10A, 11A, 12A, 13A, 14A, 15A, 16A, and 17A, respectively.

Referring to FIGS. 9A to 17B, the method of manufacturing a multi-level device of the present invention will be described in detail below.

Figure 9A:
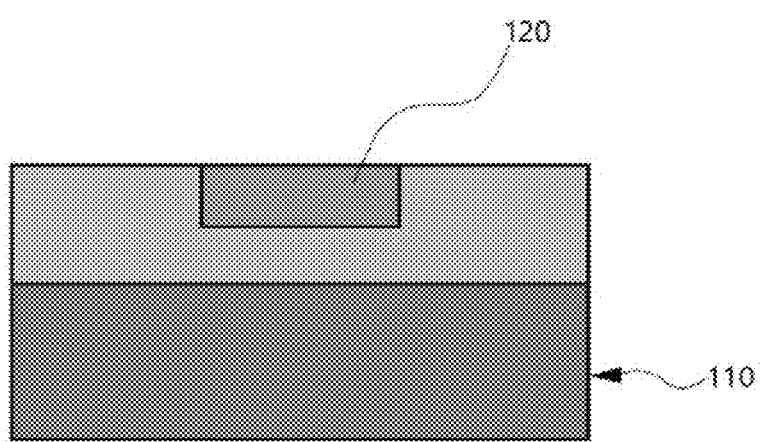
FIGS. 9A to 17B are diagrams illustrating a method of manufacturing a multi-level device of the present invention.
Figure 9B:
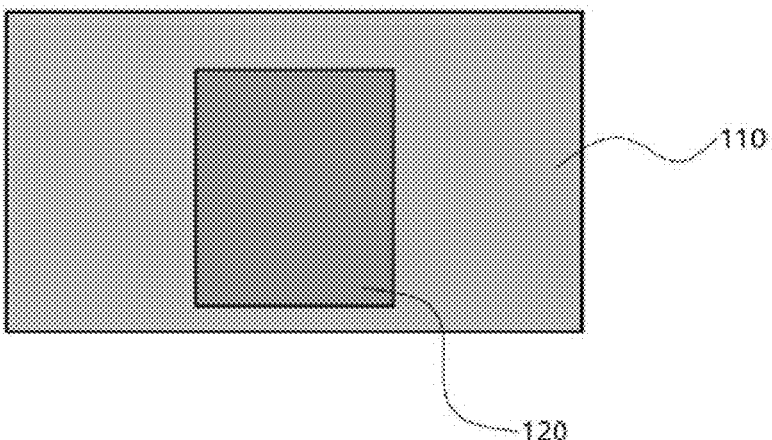

First, referring to FIGS. 9A and 9B, a gate electrode 120 is formed on the substrate 110.

Here, the substrate 110 may be a Si substrate having a surface of on which $SiO_2$ is formed, the surface of the substrate 110 is patterned using a photolithography process, and then the gate electrode 120 is deposited on the patterned portion, and thus the gate electrode 120 may be formed to be embedded in the surface of the substrate 110. In this case, an upper surface of the gate electrode 120 may be formed to be coplanar with an upper surface of the substrate 110. The gate electrode 120 may include Au or Pt.

Figure 10A:
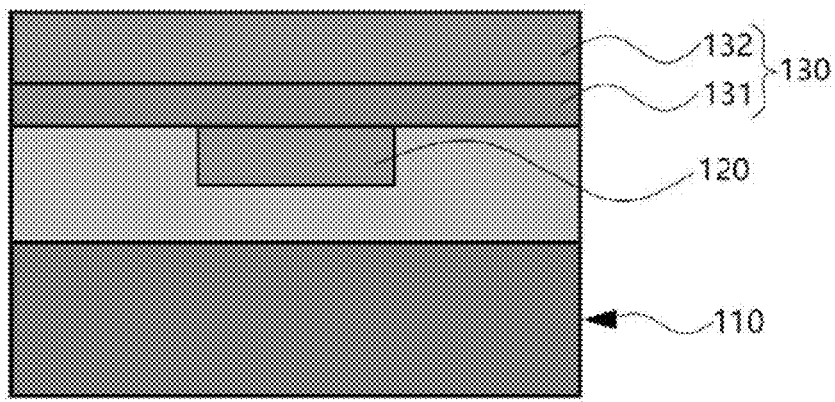
Figure 10B:
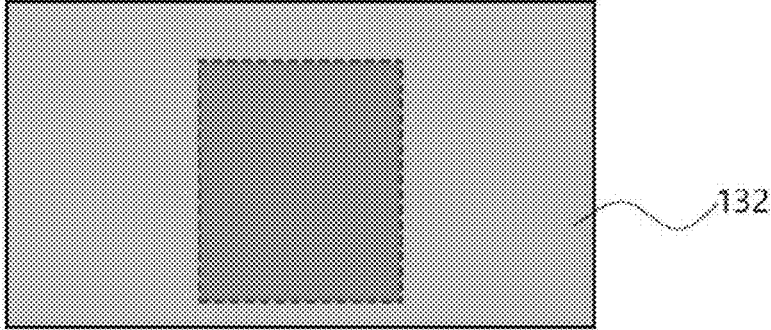

Referring to FIGS. 10A and 10B, a first separation layer 130 is formed on the gate electrode 120. The formation of the first separation layer 130 may be divided into the step of forming a first dielectric layer 131 and the step of forming a first organic polymer layer 132.

First, the first dielectric layer 131 may be formed on the gate electrode 120 and a surface of the substrate 110 surrounding the gate electrode 120. The first dielectric layer 131 may be formed by depositing $Al_2O_3$ on the surfaces of the gate electrode 120 and the substrate 110 using atomic layer deposition (ALD). The first dielectric layer 131 may be formed to have a thickness ranging from 5 nm to 15 nm.

After the first dielectric layer 131 is formed, the first organic polymer layer 132 is formed on the first dielectric layer 131. The first organic polymer layer 132 may be formed of any one of PMMA, PS, PVP, PVA, and PI, and preferably, PMMA or PS may be used, and more preferably, PMMA may be used. For example, the first organic polymer layer 132 may be formed by depositing PMMA on the first dielectric layer 131 using spin coating. The first organic polymer layer 132 may be formed to have a thickness ranging from 20 nm to 30 nm, and more specifically, the first organic polymer layer 13 may be formed to have a thickness of 20 nm on the first dielectric layer 131 using spin coating. Accordingly, the first separation layer 130 formed in a dual structure of $Al_2O_3$/PMMA may be formed on the gate electrode 120 and the substrate 110.

Figure 11A:
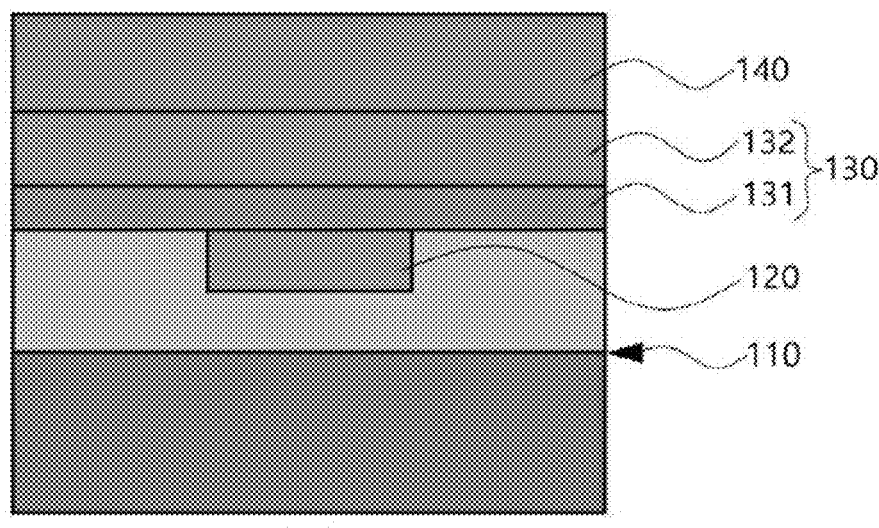
Figure 11B:
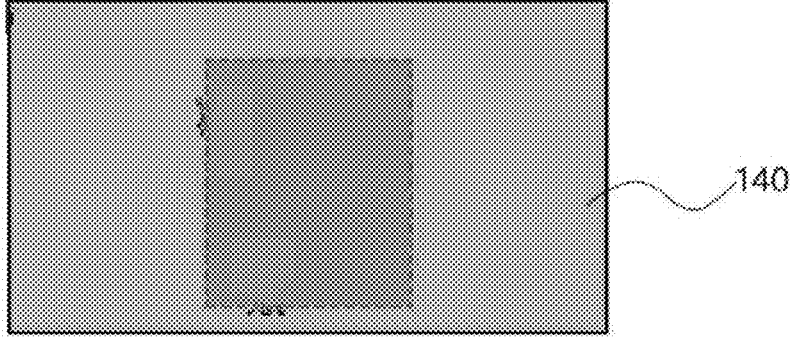

Referring to FIGS. 11A and 11B, a first channel layer 140 is formed on the first separation layer 130. The first channel layer 140 may include DNTT, pentacene, tetracene, oligothiophene, polythiophene, metal phthalocyanine, polyphenylene, polyvinylenephenylene, polyfluorene, or fullerene (C60), and preferably, DNTT may be formed on the first separation layer 130 with a thickness of 40 nm using thermal evaporation.

Figure 12A:
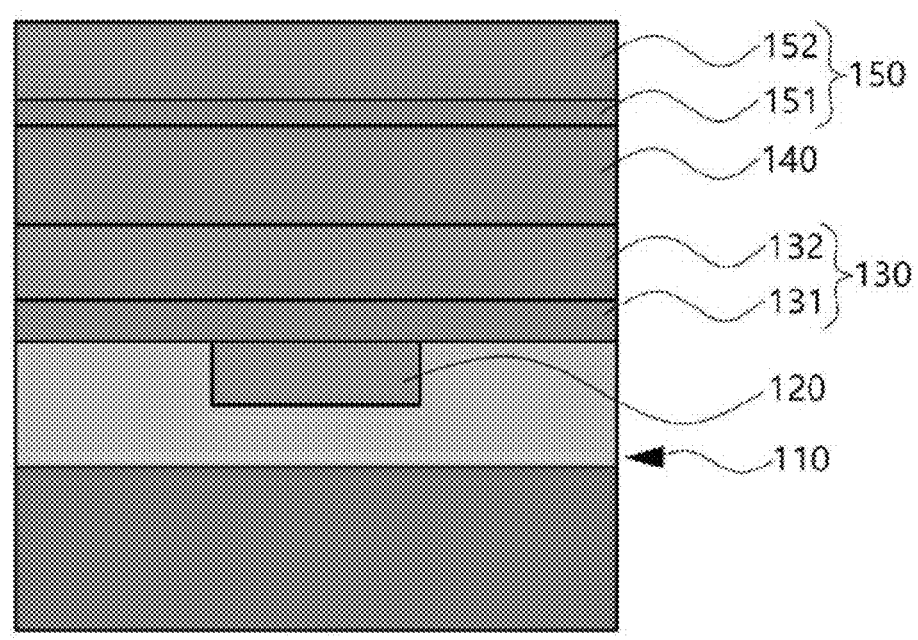
Figure 12B:
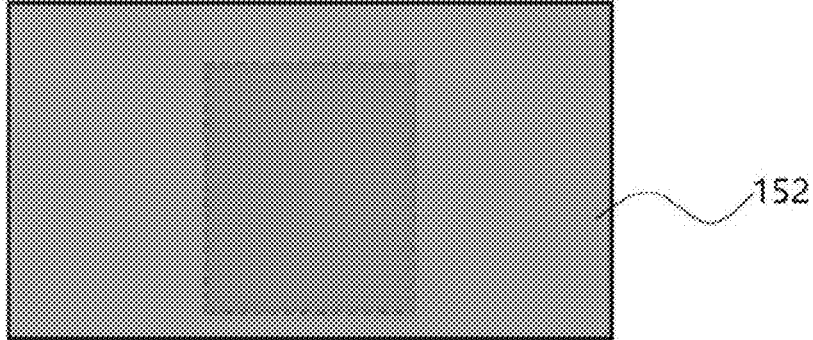

Referring to FIGS. 12A and 12B, a second separation layer 150 is formed on the first channel layer 140. The formation of the second separation layer 150 may be divided into step of forming a second dielectric layer 151 and the step of forming a second organic polymer layer 152.

First, the second dielectric layer 151 may be formed on the first channel layer 140. The second dielectric layer 151 may be formed by depositing $Al_2O_3$ on the first channel layer 140 using ALD. The second dielectric layer 151 may be formed to have a thickness ranging from 5 nm to 15 nm.

After the second dielectric layer 151 is formed, the second organic polymer layer 152 is formed on the second dielectric layer 151. The second organic polymer layer 152 may be formed of any one of PMMA, PS, PVP, PVA, and PI, and preferably, PMMA or PS may be used, and more preferably, PMMA that is the same as the first organic polymer layer 132 may be used. For example, the second organic polymer layer 152 may be formed by depositing PMMA on the second dielectric layer 151 using spin coating. The second organic polymer layer 152 may be formed to have a thickness ranging from 20 nm to 30 nm, and more specifically, the second organic polymer layer 152 may be formed to have a thickness of 20 nm on the second dielectric layer 151 using spin coating. Accordingly, the second separation layer 150 formed in a dual structure of $Al_2O_3$/PMMA may be formed on the gate electrode 120 and the substrate 110.

Figure 13A:
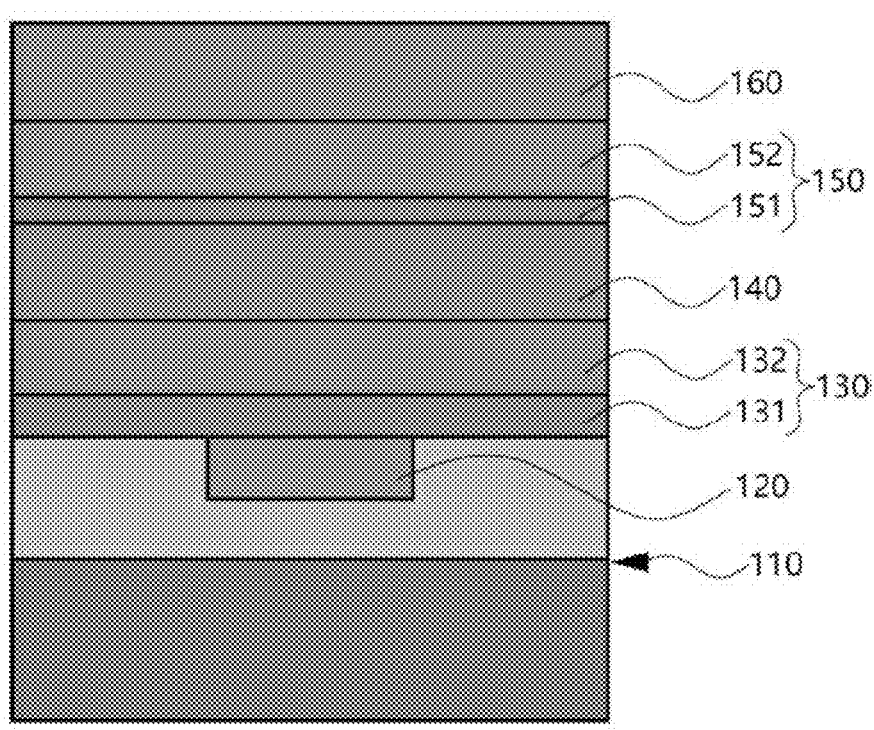
Figure 13B:
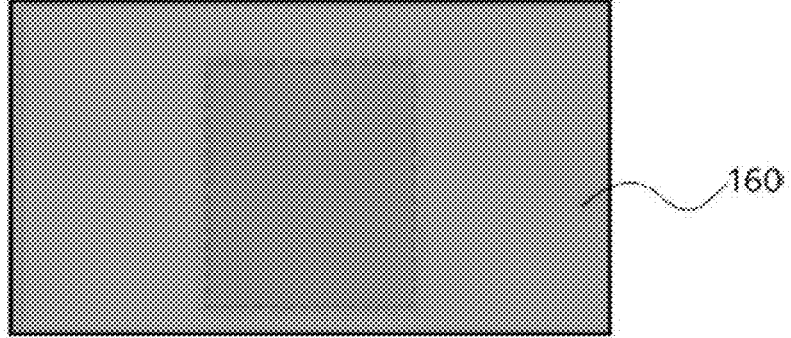
Figure 14A:
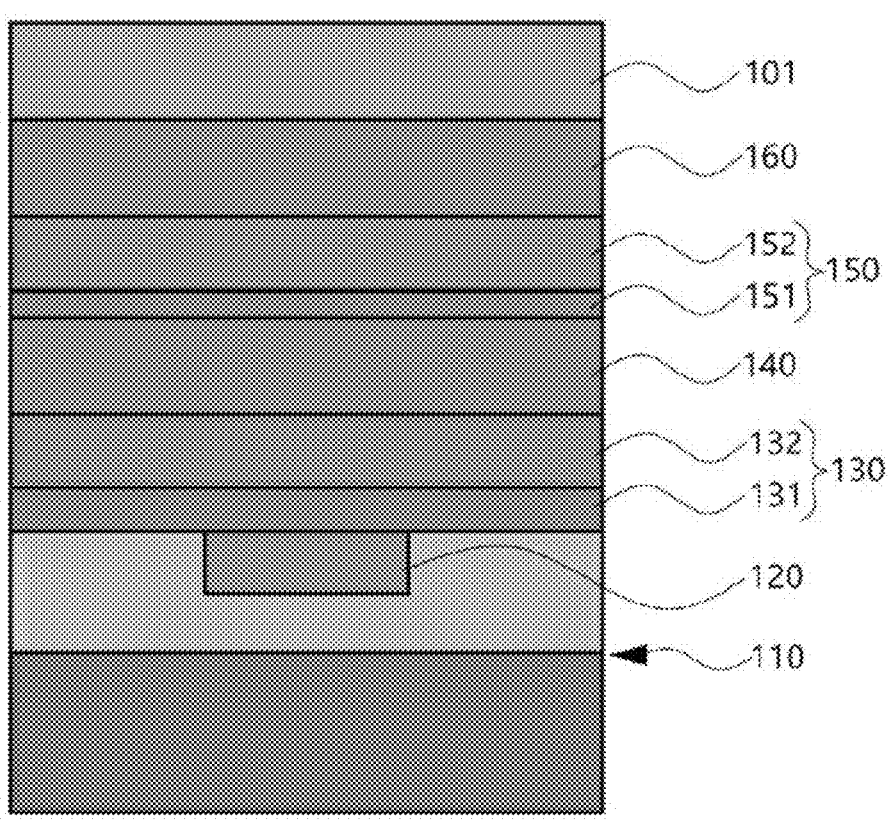
Figure 14B:
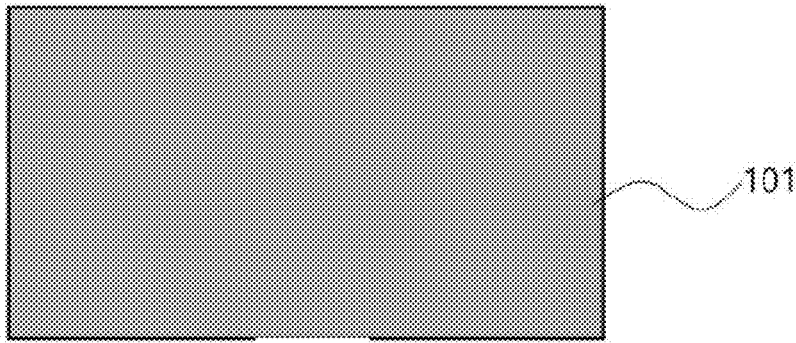

Referring to FIGS. 13A and 13B, a second channel layer 160 is formed on the second separation layer 150. The second channel layer 160 may include DNTT, pentacene, tetracene, oligothiophene, polythiophene, metal phthalocyanine, polyphenylene, polyvinylenephenylene, polyfluorene, or fullerene (C60), and preferably, DNTT that is the same as the first channel layer 140 may be formed on the second separation layer 150 with a thickness of 40 nm using vacuum deposition.

Referring to FIGS. 14A to 17B, a source electrode 170 and a drain electrode 180 are formed on the second channel layer 160. First, referring to FIGS. 14A and 14B, a metal layer 101 may be formed on the second channel layer 160 using evaporation. The metal layer 101 may include at least one among Au, Ag, Pt, Cr, Ti, Cu, Al, Ta, Mo, W, Ni, Pd, and an alloy thereof. Au may be used.

Figure 15A:
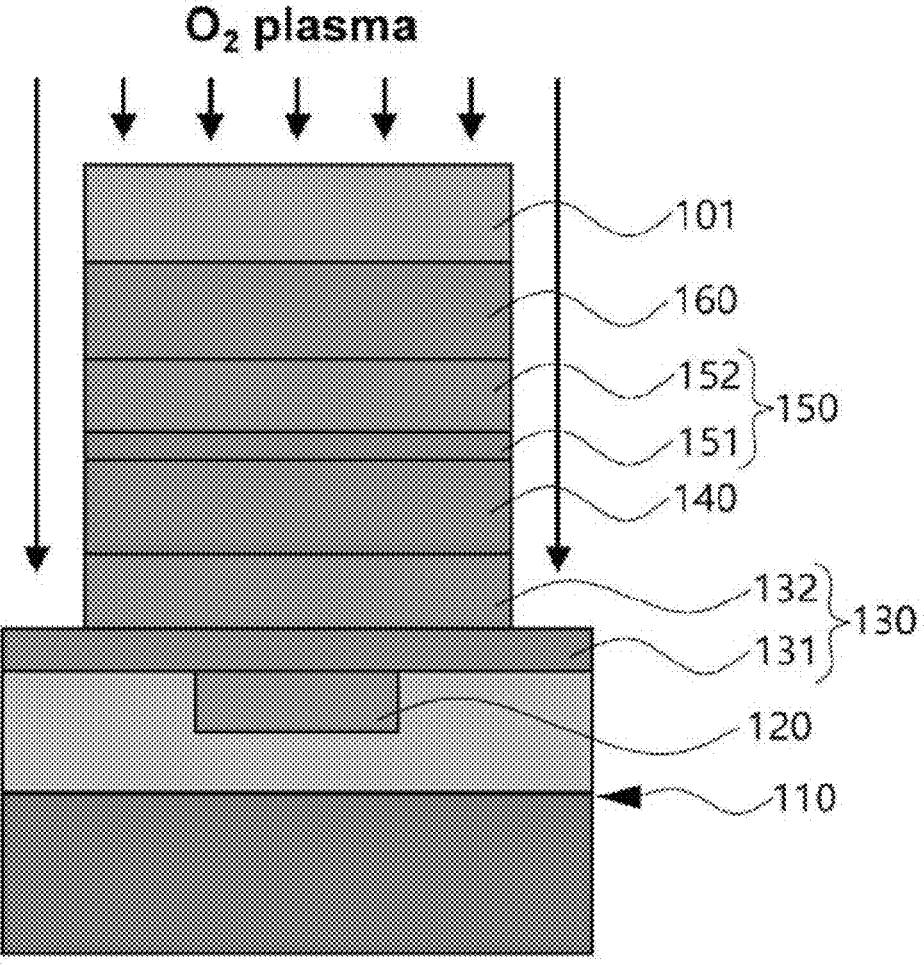
Figure 15B:
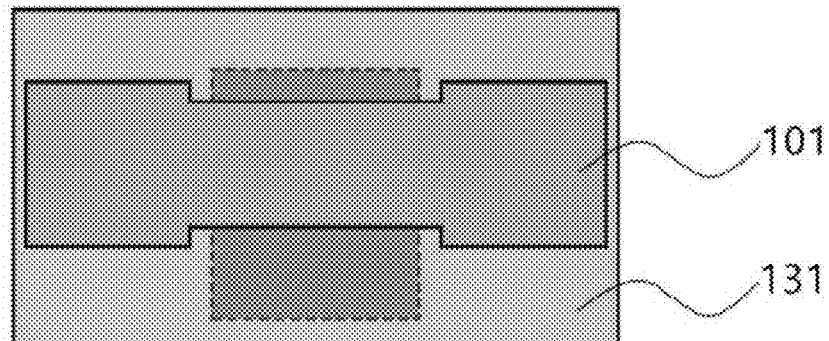

Referring to FIGS. 15A and 15B, after the deposited metal layer 101 is patterned using a photolithography process, the first separation layer 130, the first channel layer 140, the second separation layer 150, and the second channel layer 160 are patterned in the form of the patterned metal layer 101 using an $O_2$ plasma etching process.

Figure 16A:
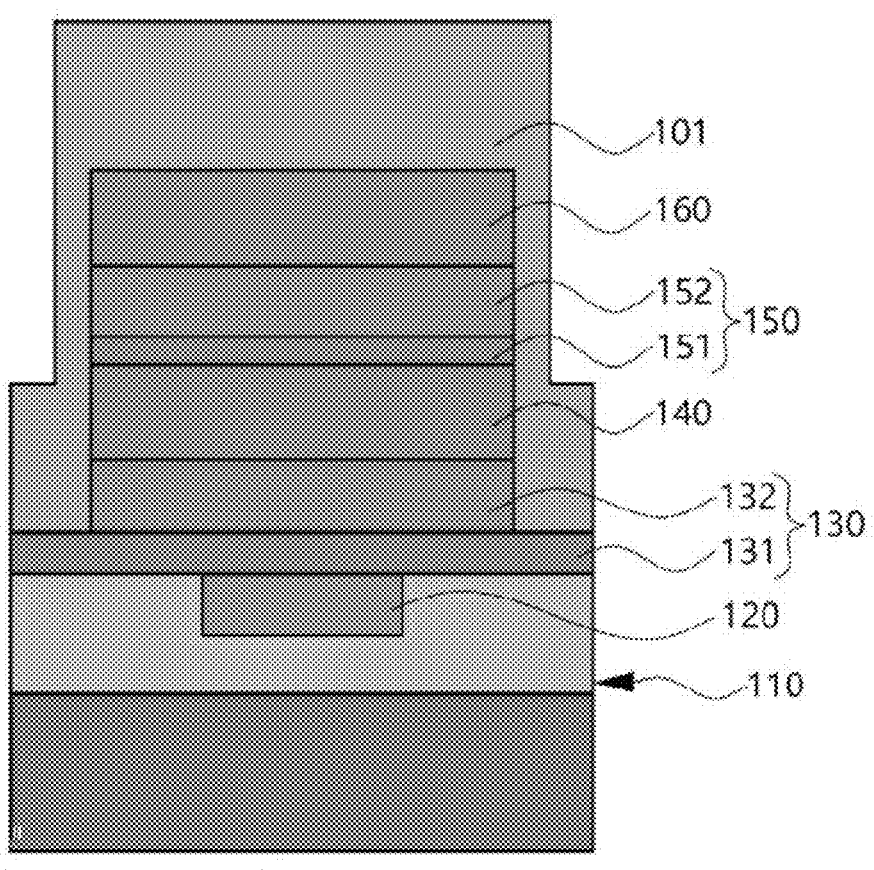
Figure 16B:
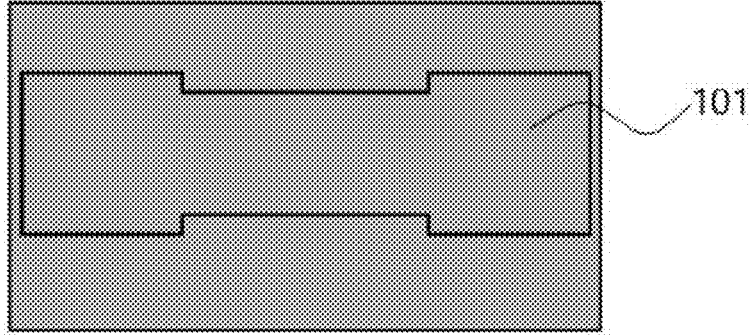

Referring to FIGS. 16A and 16B, the metal layer 101 is deposited again using vacuum deposition to surround the first separation layer 130, the first channel layer 140, the second separation layer 150, the second channel layer 160, and the metal layer 101, which are patterned. The metal layer 101 is entirely deposited once again so that the channel layers 140 and 160, which are vulnerable to a chemical process, may be protected in a patterning process of forming the source electrode 170 and the drain electrode 180.

Figure 17A:
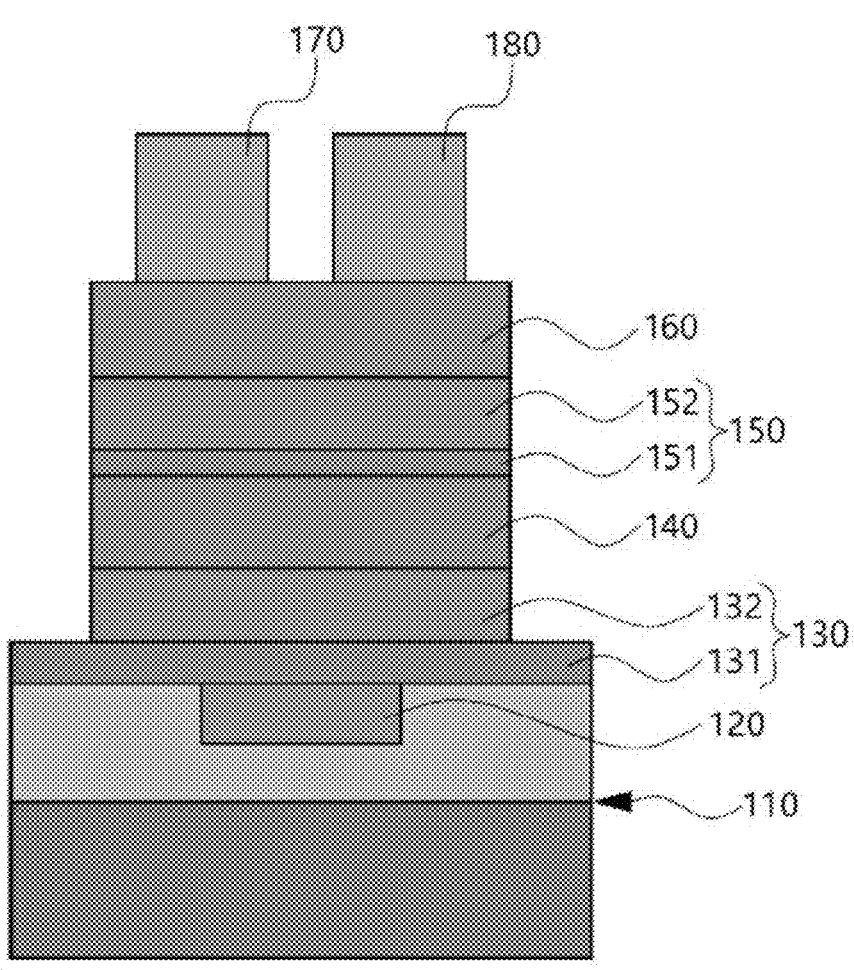
Figure 17B:
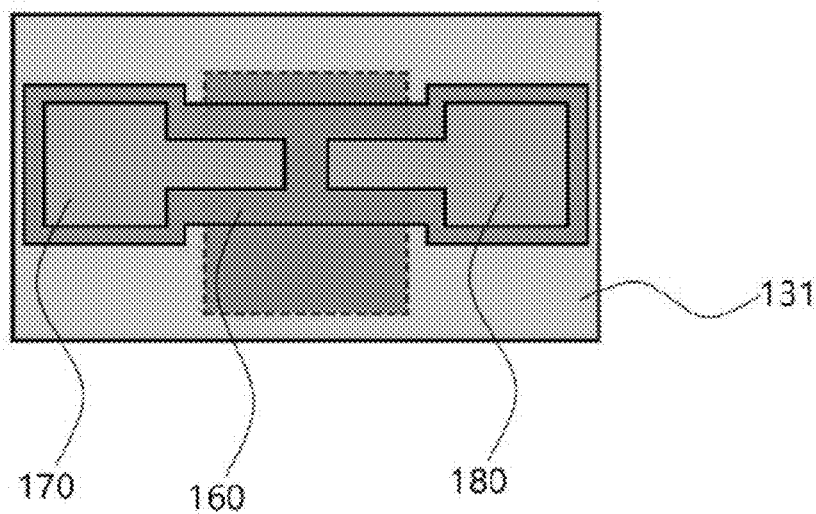

Referring to FIGS. 17A and 17B, the source electrode 170 and the drain electrode 180 are patterned on the additionally deposited metal layer 101 using a photolithography process and a wet etch process, and metal layers, excluding the electrode 170 and the drain electrode 180, are removed so that the source electrode 170 and the drain electrode 180 may be formed on the second channel layer 160.

Experimental Example

The gate electrode 120 of Au is formed to be buried in the $SiO_2$/Si substrate 110 using a photolithography process, and the $Al_2O_3$ 131 with a thickness of 10 nm and the PMMA 132 with a thickness of 20 nm are sequentially deposited on the gate electrode 120 and the substrate 110 using ALD and spin coating. The DNTT 140 with a thickness of 40 nm is deposited on the $Al_2O_3$/PMMA 130 using evaporation, and the $Al_2O_3$/PMMA 150 and the DNTT 160 are deposited on the DNTT 140 again to form a separation layer and a channel layer. In addition, a P-type multi-level device is manufactured by patterning the metal layer of Au using a photolithography process and a wet etch process to form the source electrode 170 and the drain electrode 180 on the channel layer.

Figure 18A:
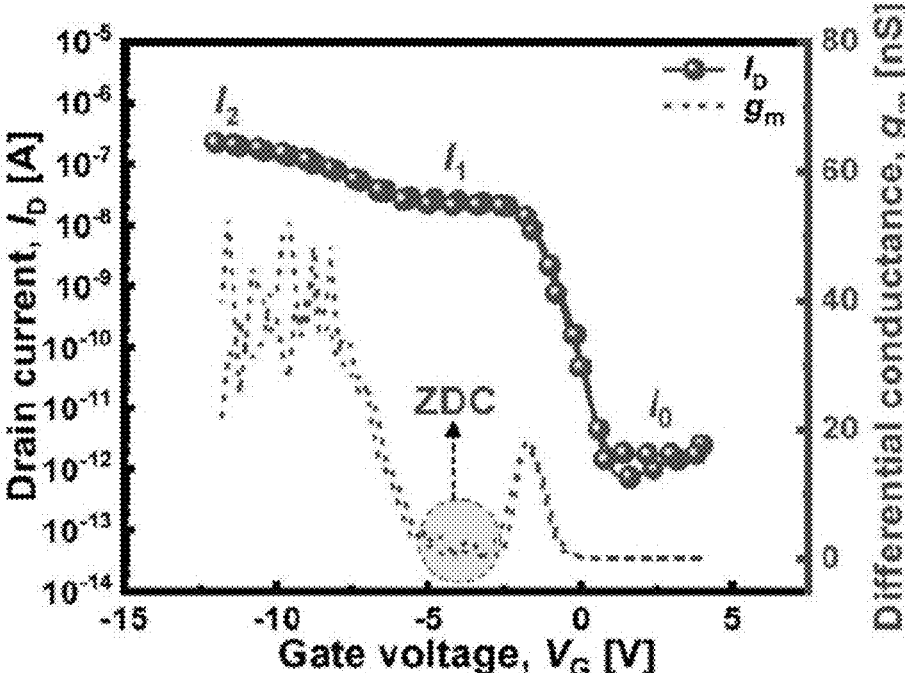
FIGS. 18A and 18B are graphs showing current-voltage curves according to an experimental example of the multi-level device of the present invention.
Figure 18B:
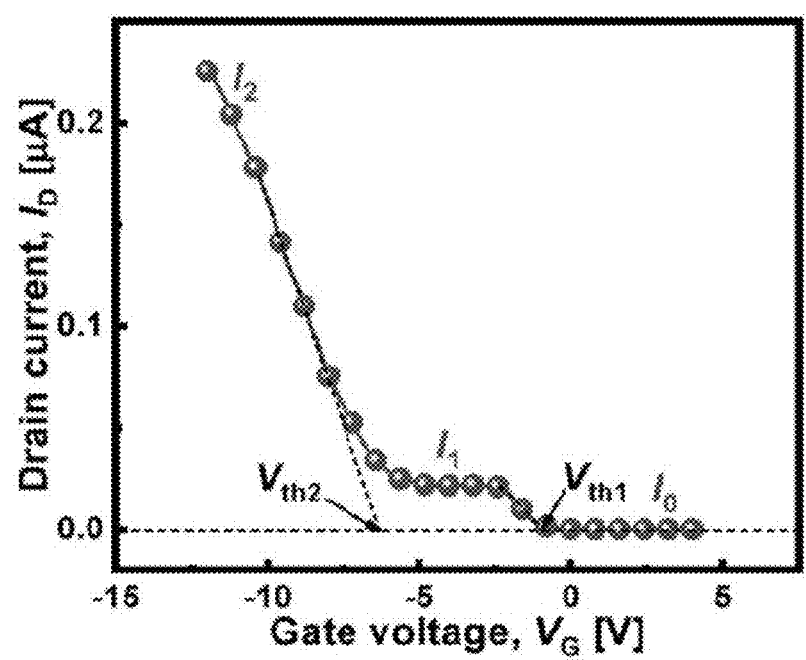

FIGS. 18A and 18B are graphs showing current-voltage curves according to an experimental example of the multi-level device of the present invention.

Here, FIG. 18A shows a change of a current ID according to a gate voltage and a zero differential conductance (ZDC) property, and FIG. 18B shows a threshold voltage according to the current change.

First, referring to FIG. 18A, it can be confirmed that the multi-level device of the present invention exhibited a characteristic of a P-type multi-level device and had three current states of an off-current state $I_0$, an intermediate current state $I_1$, and an on-current state $I_2$, which are characteristics of a ternary device. In addition, it can be confirmed that the intermediate current state $I_1$ exhibited a saturated form so that a ZDC characteristic is exhibited.

Referring to FIG. 18B, it can be confirmed that, when the gate voltage $V_G$ increased in the negative direction in the off-current $I_0$ state and thus a voltage that is greater than the first threshold voltage $V_{th1}$ is applied, the current increased to become the intermediate current $I_1$ state, and when the gate voltage $V_G$ increased in the negative direction in the intermediate current $I_1$ state and thus a voltage that is greater than the second threshold voltage $V_{th2}$ is applied, the current becomes the on-current $I_2$ state in which the current increases rapidly. That is, it can be confirmed that the ternary device characteristic, which is a ternary logic characteristic, is exhibited.

Figure 19:
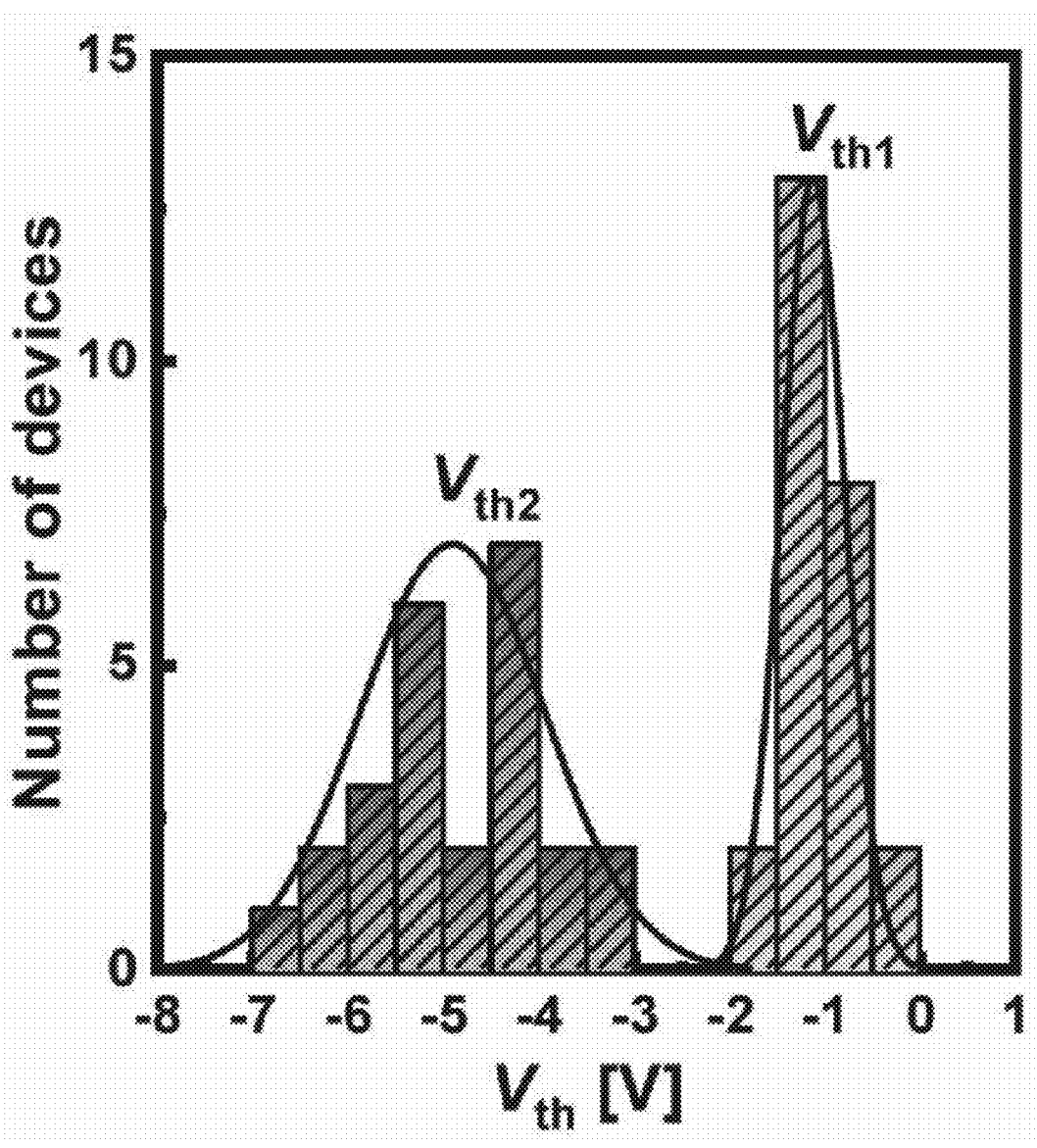
FIG. 19 is a graph showing a threshold voltage characteristic of the multi-level device of the present invention.

FIG. 19 is a graph showing a threshold voltage characteristic of the multi-level device of the present invention.

Here, FIG. 19 shows a graph showing threshold voltages of multi-level devices using extrapolation after a plurality of multi-level devices of the present invention are manufactured in the same process and a threshold voltage of each multi-level device is measured.

Referring to FIG. 19, it can be confirmed that the first threshold voltage $V_{th1}$ and the second threshold voltage $V_{th2}$ are measured in each of the plurality of multi-level devices so that the ternary device characteristic is exhibited, and it can be confirmed that a threshold voltage distribution, which is measured in the plurality of multi-level devices, exhibits a tight distribution in both the first threshold voltage $V_{th1}$ and the second threshold voltage $V_{th2}$, and thus a reliable device characteristic is exhibited.

Figure 20:
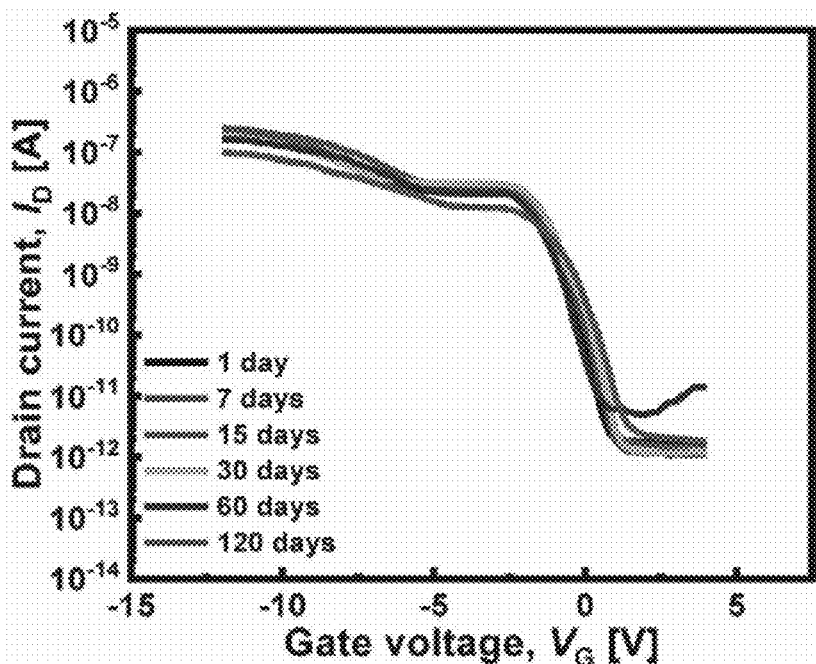
FIG. 20 is a graph showing a current-voltage curve of the multi-level device of the present invention that is repeatedly measured for a certain period of time.

FIG. 20 is a graph showing a current-voltage curve of the multi-level device of the present invention that is repeatedly measured for a specific period of time.

Here, FIG. 20 shows a current-voltage curve obtained by measuring the multi-level device of the present invention for 120 days at regular intervals.

Referring to FIG. 20, as a result of repeatedly measuring the multi-level device of the present invention for a period of 120 days, it can be confirmed that the ternary device characteristic is stably measured for the period of 120 days. That is, it can be confirmed that, even though the organic material of DNTT is used for the channel layer, the multi-level device has a stable device characteristic for a considerable period of time in the air.

13

14

Figure 21:
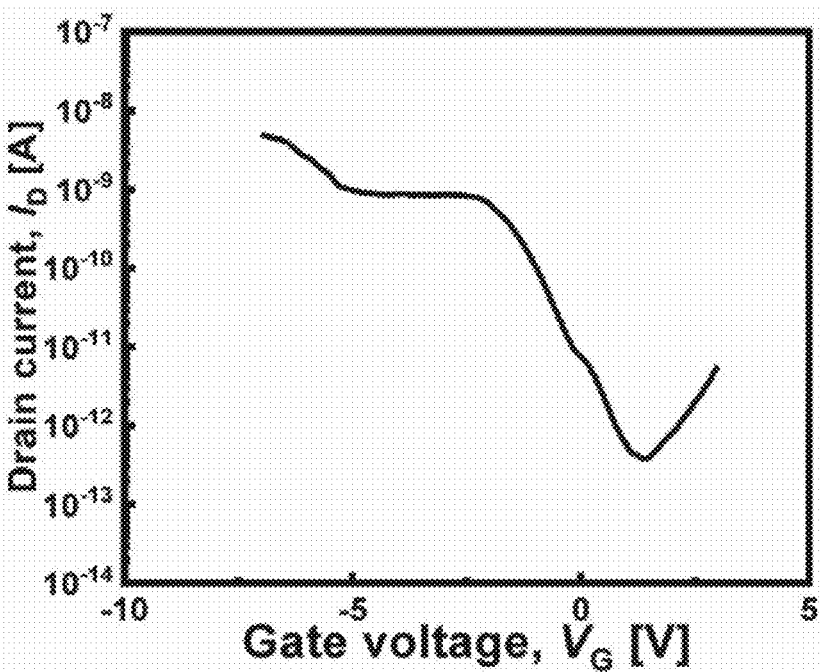
FIG. 21 is a graph showing an experimental result of the multi-level device according to another embodiment of the present invention.

FIG. 21 is a graph showing an experimental result of the multi-level device according to another embodiment of the present invention.

The experimental result shown in FIG. 21 is illustrated as a graph showing a current-voltage characteristic when only a material of the organic polymer layer of the multi-level device is changed from PMMA to PS, and the organic polymer layer of PS is formed to have a thickness of 20 nm.

Referring to FIG. 21, it can be confirmed that, even when PS is used as the organic polymer layer instead of PMMA, a ternary device characteristic, which is the ternary logic device characteristic, is exhibited and a stable device characteristic, in which hysteresis is removed, is exhibited.

As described above, the multi-level device according to the present invention may have a plurality of turn-on voltages, that is, a plurality of threshold voltages, thereby providing multi-level conductivity as the ternary device characteristic. In addition, a double insulating layer made of a dielectric layer and an organic polymer layer is used as a separation layer for channel layer separation, by removing the hysteresis due to the trap charge at the interface between the channel layer and the insulating layer, the uniform ternary characteristic may always be maintained, and by forming the channel layer on the organic polymer layer, the channel layer may be more stably formed on the insulating layer.

In accordance with the present invention, a multi-level device can have a plurality of turn-on voltages, that is, a plurality of threshold voltages, thereby providing multi-level conductivity as a ternary device characteristic.

In addition, a double insulating layer made of a dielectric layer and an organic polymer layer is used as a separation layer for channel layer separation, and by removing hysteresis due to a trap charge at an interface between the channel layer and an insulating layer, a uniform ternary characteristic can always be maintained.

Furthermore, by forming the channel layer on the organic polymer layer, the channel layer can be more stably formed on the insulating layer.

It should be noted that the technical effects of the present invention are not limited to the above-described effects, and other technical effects of the present invention will be apparent to those skilled in the art from the appended claims.

Meanwhile, embodiments of the present invention disclosed in the present specification and the accompanying drawings are merely presented as specific examples to aid understanding and are not intended to limit the scope of the present invention. In addition to the embodiments disclosed herein, it is obvious to those skilled in the art to which the present invention pertains that other modifications may be implemented on the basis of the technical spirit of the present invention.

What is claimed is:

1. A multi-level device comprising:
a substrate;
a gate electrode formed on the substrate;
a first separation layer formed on the substrate and the gate electrode;
a first channel layer formed on the first separation layer;
a second separation layer formed on the first channel layer;

a second channel layer formed on the second separation layer; and
a source electrode and a drain electrode which are formed on the second channel layer,
wherein each of the first separation layer and the second separation layer includes an organic polymer layer,
wherein the first separation layer includes:
a first dielectric layer formed on the substrate and the gate electrode; and
a first organic polymer layer formed on the first dielectric layer, and
wherein the second separation layer includes:
a second dielectric layer formed on the first channel layer; and
a second organic polymer layer formed on the second dielectric layer.

2. The multi-level device of claim 1, wherein the first dielectric layer and the second dielectric layer are each formed of any one material among aluminum oxide, aluminum nitride, aluminum oxynitride, and aluminum nitride oxide.

3. The multi-level device of claim 1, wherein each of the first organic polymer layer and the second organic polymer layer includes a polymer-based material.

4. The multi-level device of claim 3, wherein the polymer-based material includes any one material of polymethyl methacrylate (PMMA) and polystyrene (PS).

5. The multi-level device of claim 1, wherein:
the first separation layer has a thickness ranging from 30 nm to 50 nm; and
the first organic polymer layer has a thickness that is greater than a thickness of the first dielectric layer.

6. The multi-level device of claim 1, wherein:
the second separation layer has a thickness ranging from 30 nm to 50 nm; and
the second organic polymer layer has a thickness that is greater than a thickness of the second dielectric layer.

7. The multi-level device of claim 1, wherein each of the first organic polymer layer and the second organic polymer layer has a thickness ranging from 20 nm to 30 nm.

8. The multi-level device of claim 1, wherein a gate voltage applied to the gate electrode is in a first voltage range, a second voltage range, and a third voltage range as the gate voltage increases in a negative direction according to an operation of the first channel layer or the second channel layer.

9. The multi-level device of claim 8, wherein:
a channel is formed in the second channel layer in the first voltage range; and
the channel of the second channel layer is maintained in the third voltage range, and a channel is formed in the first channel layer.

10. The multi-level device of claim 8, wherein:
a channel is formed in the second channel layer in the first voltage range; and a current flowing in the second channel layer is saturated in the second voltage range.

11. The multi-level device of claim 8, wherein a threshold voltage for forming a channel in the first voltage range and a threshold voltage for forming a channel in the third voltage range have different values.

* * * * *